(12) United States Patent
Choi

(10) Patent No.: US 8,339,191 B2
(45) Date of Patent: Dec. 25, 2012

(54) VOLTAGE GENERATION CIRCUIT

(75) Inventor: Won Beom Choi, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 150 days.

(21) Appl. No.: 12/647,788

(22) Filed: Dec. 28, 2009

(65) Prior Publication Data

US 2010/0283516 A1 Nov. 11, 2010

(30) Foreign Application Priority Data

May 11, 2009 (KR) .................. 10-2009-0040711

(51) Int. Cl.
*G05F 1/10* (2006.01)
*G05F 3/02* (2006.01)

(52) U.S. Cl. ......... 327/541; 327/142; 327/143; 327/540

(58) Field of Classification Search .................. 327/142, 327/143, 198, 530, 538–543, 546; 323/312–317
See application file for complete search history.

(56) References Cited

U.S. PATENT DOCUMENTS

| | | | | |
|---|---|---|---|---|
| 4,804,865 A * | 2/1989 | Clark, II | .................. | 327/541 |
| 5,920,185 A * | 7/1999 | Ozoe | .................. | 323/315 |
| 6,249,174 B1 * | 6/2001 | Tsunezawa | .................. | 327/538 |
| 6,501,303 B1 * | 12/2002 | Suyama | .................. | 327/81 |
| 6,894,473 B1 * | 5/2005 | Le et al. | .................. | 323/314 |
| 7,046,079 B2 * | 5/2006 | Van Blerkom et al. | .................. | 327/543 |
| 2002/0033720 A1 * | 3/2002 | Ikehashi et al. | .................. | 327/143 |
| 2004/0004513 A1 * | 1/2004 | Rhee et al. | .................. | 327/540 |
| 2006/0145749 A1 * | 7/2006 | Bhattacharya et al. | .................. | 327/538 |

FOREIGN PATENT DOCUMENTS

KR 1020030085237 11/2003

OTHER PUBLICATIONS

Notice of Allowance issued from Korean Intellectual Property Office on Mar. 2, 2011.

* cited by examiner

*Primary Examiner* — Lincoln Donovan
*Assistant Examiner* — Brandon S Cole
(74) *Attorney, Agent, or Firm* — IP & T Group LLP

(57) ABSTRACT

A reference voltage generation circuit includes a driving control unit configured to output an enable signal during a first time period in response to a power-on reset (POR) signal, a reference voltage generation unit configured to have an initial operation determined in response to the enable signal and to output a reference voltage maintained at a constant voltage level after the first time period, and a reference voltage control unit configured to fix the voltage level of the reference voltage to a first voltage upon a voltage level of the reference voltage being increased to at least a set voltage level.

16 Claims, 2 Drawing Sheets

VOLTAGE GENERATION CIRCUIT

CROSS-REFERENCE TO RELATED APPLICATIONS

Priority to Korean patent application number 10-2009-0040711 filed on May 11, 2009, the entire disclosure of which is incorporated by reference herein, is claimed.

BACKGROUND OF THE INVENTION

An embodiment of the present invention relates to a voltage generation circuit configured to generate a reference voltage which is not affected by an abnormal power-on reset signal.

In semiconductor memory devices, in particular, in non-volatile memory devices which can be electrically erased and programmed, to perform an erase operation for erasing data stored in a memory cell and a program operation for storing data in a memory cell, Fowler-Nordheim (FN) tunneling and hot electron injection techniques are being used.

In current memory devices and all fields for developing chips, reducing the size of the devices and chips is becoming a big issue. For this reason, the switch of technology changes quickly and a driving voltage is gradually lowered for a reduced operating power.

A nonvolatile memory device must be supplied with sufficient power for a stable operation, which has led to an increased driver size. On the other hand, to reduce the amount of current for the operation, an external voltage EXT_VDD is not all supplied, but is lowered through a voltage down converter (hereinafter referred to as a 'VDC') and then supplied.

To generate the down-converted voltage of VDC or to regularly maintain the voltage level of an operation voltage, a reference voltage Vref for maintaining a constant voltage level is used.

Accordingly, there is a need for a circuit for outputting the reference voltage Vref that is maintained at a constant voltage level.

SUMMARY OF THE INVENTION

An embodiment of the present invention relates to a reference voltage generation circuit capable of controlling a reference voltage level such that, even though a power-on reset POR signal is abnormal, the reference voltage level does not rise.

A reference voltage generation circuit according to an embodiment of the present invention includes a driving control unit configured to output an enable signal during a first time period in response to a power-on reset (POR) signal, a reference voltage generation unit configured to have an initial operation determined in response to the enable signal and to output a reference voltage maintained at a constant voltage level after the first time period, and a reference voltage control unit configured to fix the voltage level of the reference voltage to a first voltage upon a voltage level of the reference voltage being increased to at least a set voltage level.

The voltage level of the reference voltage outputted from the reference voltage generation unit is increased after the first time period.

A voltage level of the POR signal is at a high level during the first time period.

The reference voltage control unit includes a first diode and a first transistor coupled in series between an output terminal of the reference voltage generation unit and a ground terminal; the first transistor being turned on or off in response to the POR signal.

The first diode is turned on upon the reference voltage being increased to at least the set voltage level.

The first voltage is a threshold voltage of the first transistor.

The reference voltage control unit outputs the reference voltage equal to the first voltage upon the reference voltage being increased to at least the set voltage level, and outputs the reference voltage without a change upon the reference voltage being less than or equal to the reference voltage level.

A reference voltage generation circuit according to another embodiment of the present invention includes a reference voltage generation unit configured to generate a reference voltage in response to a POR signal, and a trimming unit configured to operate in response to the POR signal and to trim the reference voltage while the POR signal is at least a set voltage level.

The trimming unit includes a first diode and a first transistor coupled in series between an output terminal of the reference voltage generation unit and a ground terminal, the first transistor being turned on or off in response to the POR signal.

The first diode is turned on upon the voltage level of the reference voltage being increased to at least the set voltage level.

The trimming unit is configured to trim the reference voltage to a threshold voltage of the first transistor upon the POR signal being at least the set voltage level.

A voltage generation circuit according to yet another embodiment of the present invention includes a reference voltage generation unit configured to generate a reference voltage in response to a POR signal, a trimming unit configured to operate in response to the POR signal and to trim the reference voltage while the POR signal is at least a set voltage level; and a voltage-down converter configured to generate an internal voltage in response to the reference voltage.

DESCRIPTION OF THE INVENTION

Figure 1:
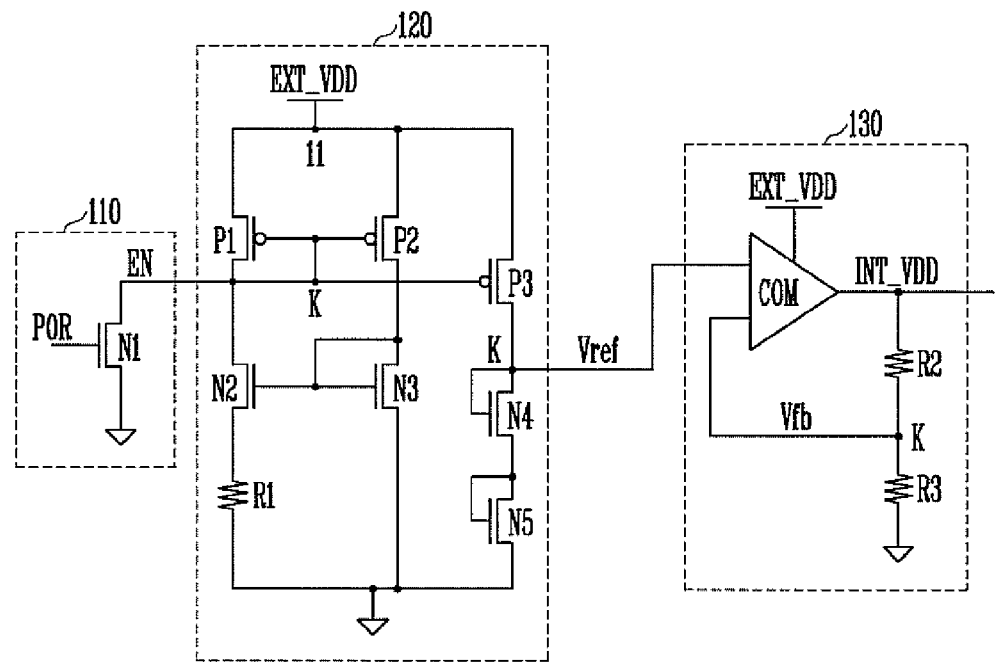
FIG. 1 shows a circuit for generating down-converted voltage.

Hereinafter, an embodiment of the present invention is described in detail with reference to the accompanying drawings. The drawing figures are provided to allow those having ordinary skill in the art to understand the scope of an embodiment of the invention.

FIG. 1 shows a circuit for generating down-converted voltage.

Referring to FIG. 1, the circuit includes a driving control unit 110, a reference voltage generation unit 120, and a VDC circuit 130.

The driving control unit 110 is configured to output an enable signal EN in response to a power-on reset (hereinafter referred to as a 'POR') signal. In response to the enable signal EN, the reference voltage generation unit 120 is configured to output a reference voltage Vref that is maintained at a constant voltage level.

The VDC circuit 130 is configured to divide an external voltage EXT_VDD using second and third resistors R2 and R3 and to output a divided voltage as a down-converted voltage INT_VDD. Here, the VDC circuit 130 controls the down-converted voltage INT_VDD using the reference voltage Vref such that the down-converted voltage INT_VDD is maintained at a constant voltage level.

That is, the VDC circuit 130 is configured to compare the reference voltage Vref and a feedback voltage Vfb, divided by the second and third resistors R2 and R3, and to regularly maintain the down-converted voltage INT_VDD based on a result of the comparison.

The voltage level of the reference voltage Vref outputted from the reference voltage generation unit 120 varies according to the voltage level of the enable signal EN. The voltage level of the enable signal EN varies according to the voltage level of the POR signal.

It can be said that the time that the power inputted is determined in response to the POR signal. The POR signal can normally operate in a typical power-up state, but the voltage level of the POR signal may abnormally vary when a fast power ramp-up operation is performed.

Figure 2:
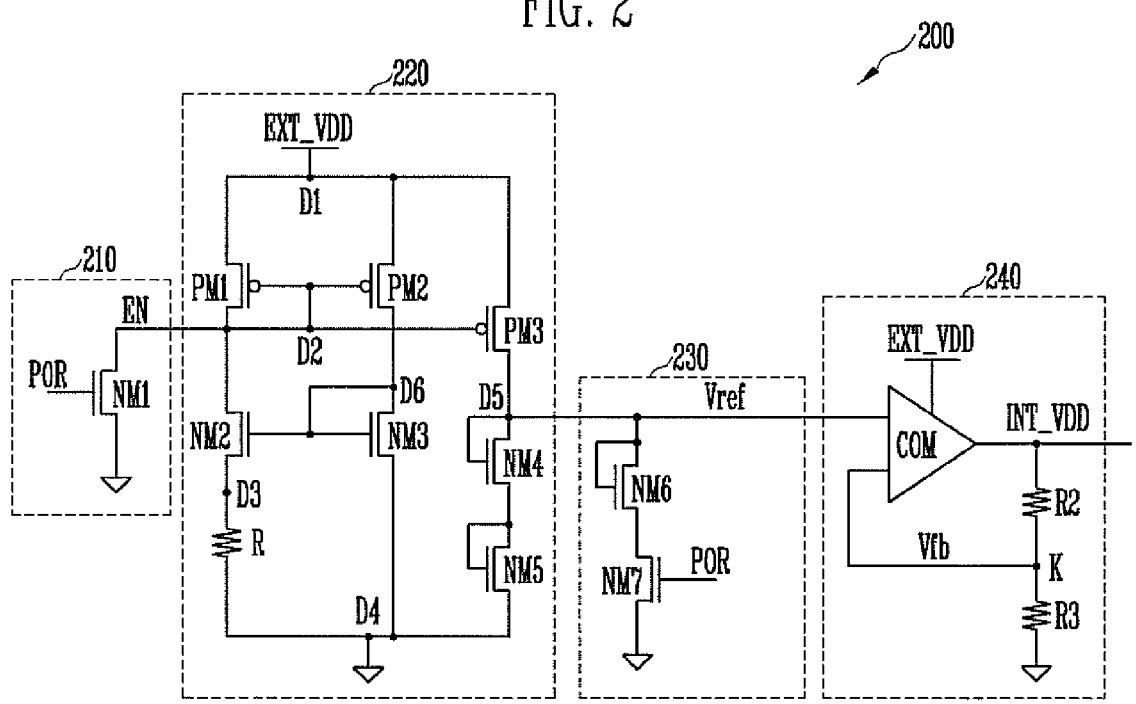
FIG. 2 shows a reference voltage generation circuit according to an embodiment of the present invention.

FIG. 2 shows a reference voltage generation circuit according to an embodiment of the present invention.

Referring to FIG. 2, the voltage generation circuit 200 according to the embodiment of the present invention includes a driving control unit 210, a reference voltage generation unit 220, a reference voltage control unit 230, and a VDC circuit 240.

The driving control unit 210 is configured to output an enable signal EN in response to a POR signal. The reference voltage generation unit 220 is configured to generate a reference voltage Vref in response to the enable signal EN.

If the POR signal abnormally increases and maintains a high level, the reference voltage control unit 230 controls the voltage level of the reference voltage Vref such that the reference voltage Vref does not increase. During the time when the POR signal abnormally increases and maintains a high level, the reference voltage control unit 230 trims the reference voltage Vref and outputs a result of the trimming.

The VDC circuit 240 is configured to generate an internal voltage INT_VDD using the reference voltage Vref.

The driving control unit 210 includes a first NMOS transistor NM1. The reference voltage generation unit 220 includes first to third PMOS transistors PM1 to PM3, second to fifth NMOS transistors NM2 to NM5, and a resistor R. The reference voltage control unit 230 includes sixth and seventh NMOS transistors NM6 and NM7.

The first NMOS transistor NM1 is coupled between a node D2 and a ground terminal. The POR signal is inputted to the gate of the first NMOS transistor NM1. When the first NMOS transistor NM1 is turned on, the enable signal EN of a low level is supplied to the node D2.

The first PMOS transistor PM1 is coupled between a node D1 and the node D2. The second PMOS transistor PM2 is also coupled between the node D1 and the node D6. The gates of the first and second PMOS transistors PM1 and PM2 are coupled in common to the node D2.

An external voltage EXT_VDD is inputted to the node D1. The second NMOS transistor NM2 is coupled between the node D2 and a node D3, and the third NMOS transistor NM3 is coupled between the node D6 and a node D4. The gates of the second and third NMOS transistors NM2 and NM3 are coupled in common to the node D6. A resistor R is coupled between the node D3 and the node D4.

The third PMOS transistor PM3 is coupled between the node D1 and a node D5, and the gate of the third PMOS transistor PM3 is coupled to the node D2.

The fourth and fifth NMOS transistors NM4 and NM5 are diode-coupled between the node D5 and the node D4. The node D4 is coupled to the ground terminal.

The sixth and seventh NMOS transistors NM6 and NM7 are coupled between the node D5 and the ground terminal. The sixth NMOS transistor NM6 is diode-coupled between the node D5 and the seventh NMOS transistor NM7. The POR signal is inputted to the gate of the seventh NMOS transistor NM7.

The sixth NMOS transistor NM6 has a large size, and is turned on when the voltage level of the node D5 is more than the voltage level of a normal reference voltage Vref.

The reference voltage Vref is outputted from the node D5.

The VDC circuit 240 is configured to down-convert the external voltage EXT_VDD by a predetermined voltage level in response to the reference voltage Vref and to generate the internal voltage INT_VDD.

The operation of the reference voltage generation circuit 200 is described below with reference to the voltage level of the POR signal.

Figure 3:
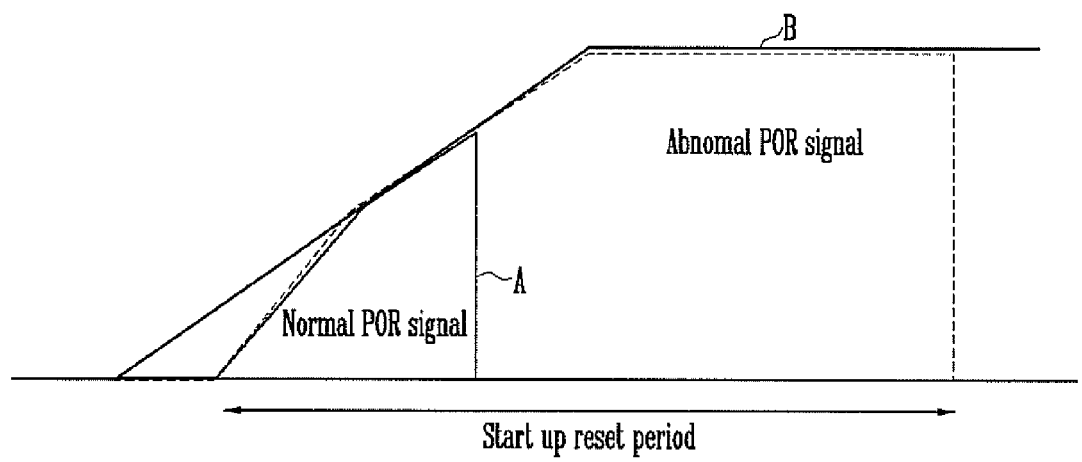
FIG. 3 is a diagram showing the voltage level of a POR signal illustrating the operation of the reference voltage generation circuit according to an embodiment of the present invention.

FIG. 3 is a diagram showing the voltage level of the POR signal illustrating the operation of the reference voltage generation circuit according to an embodiment of the present invention.

The operations of the reference voltage generation circuit 200 are described below in the case in which a POR signal is normally generated (Type A) and the case in which a POR signal is abnormally generated (Type B) are inputted.

First, the Type A POR signal slowly increases, maintains a high level for a certain period of time, and then shifts to a low level.

In this case, when the normal Type A POR signal is inputted to the reference voltage generation circuit 200, such as that shown in FIG. 2, the POR signal slowly increases, and at a certain point of time, turns on the first NMOS transistor NM1. The seventh NMOS transistor NM7 is also turned on.

When the first NMOS transistor NM1 is turned on, the enable signal EN shifts to a low level, and the voltage level of the node D2 shifts to a low level.

When the voltage level of the node D2 shifts to a low level, the first to third PMOS transistors PM1 to PM3 are turned on. Further, the POR signal increases to the high level for a certain period of time and then drops to a low level.

The first to third PMOS transistors PM1 to PM3 are turned on and the external voltage EXT_VDD is inputted to the node D5. The inputted external voltage EXT_VDD is divided by the resistance of the third PMOS transistor PM3, and the resistances of the fourth and fifth NMOS transistors NM4 and NM5, and the divided reference voltage Vref is inputted to the node D5.

Furthermore, when the POR signal shifts to a low level after a passage of a certain period of time and the first NMOS transistor NM1 is turned off, the node D2 is placed in a floating state. However, since the first and second PMOS transistors PM1 and PM2 have already been turned on, the voltage level of the node D2 shifts to a high level.

When the voltage level of the node D2 shifts to a high level, the first to third PMOS transistors PM1 to PM3 are turned off, and the second and third NMOS transistors NM2 and NM3 are turned on.

When the second and third NMOS transistors NM2 and NM3 are turned on, the node D2 is coupled to the ground terminal. Thus, the second and third NMOS transistors NM2 and NM3 are again turned off. Further, while the node D2 is coupled to the ground terminal, the third PMOS transistor PM3 is turned on.

While the above operation is repeated, the reference voltage Vref is maintained at a constant voltage level and outputted. During the time when the Type A POR signal is inputted, the voltage level of the reference voltage Vref does not abnormally rise. Accordingly, the reference voltage control unit 230 does not operate because the sixth NMOS transistor NM6 having a large size is not turned on.

Meanwhile, if the abnormal Type B POR signal is inputted, the reference voltage generation circuit 200 operates differently from the case in which the normal Type A POR signal is inputted.

As described above, the Type A POR signal maintains a high level for a certain period of time and then drops to a low level. However, the time when the Type B POR signal maintains a high level is longer than that of the Type A POR signal. In general, the Type B POR signal can be generated when a fast power ramp-up operation is performed.

If the Type B POR signal is inputted and the POR signal shifts to a high level, the first NMOS transistor NM1 remains turned on. As described above, the Type B POR signal abnormally maintains the high level.

Accordingly, the turn-on state of the first NMOS transistor NM1 is long. While the first NMOS transistor NM1 remains turned on, the node D2 is coupled to the ground terminal and the voltage level thereof is maintained at a low level.

Furthermore, while the first NMOS transistor NM1 remains turned on, the third PMOS transistor PM3 remains turned on.

When the third PMOS transistor PM3 continues to remain turned on, the external voltage EXT_VDD is continuously inputted to the node D5, and so the voltage level of the reference voltage Vref increases to at least a desired voltage level.

If the voltage level of the node D5 becomes higher than a desired voltage level, the sixth NMOS transistor NM6 is turned on. Further, the seventh NMOS transistor NM7 also maintains a high level in response to the POR signal.

Accordingly, the voltage level of the node D5 is maintained at a voltage level of about 0.7 V (i.e., the threshold voltage of the seventh NMOS transistor NM7). That is, the reference voltage Vref is maintained at 0.7 V.

If the POR signal normally shifts to a low level, the voltage level of the node D5 drops, and the sixth NMOS transistor NM6 is turned off. Further, as described above with reference to the case in which the Type A POR signal is inputted, the first NMOS transistor NM1 is turned off.

Subsequently, as the third PMOS transistor PM3 is repeatedly turned on and off, the voltage level of the node D5 maintains a normal reference voltage Vref.

Accordingly, if the POR signal does not normally operate, the voltage level of the reference voltage Vref is maintained at about 0.7 V so that a device, operating in response to the reference voltage Vref outputted from the reference voltage generation circuit, is not affected by a high reference voltage.

Figure 4:
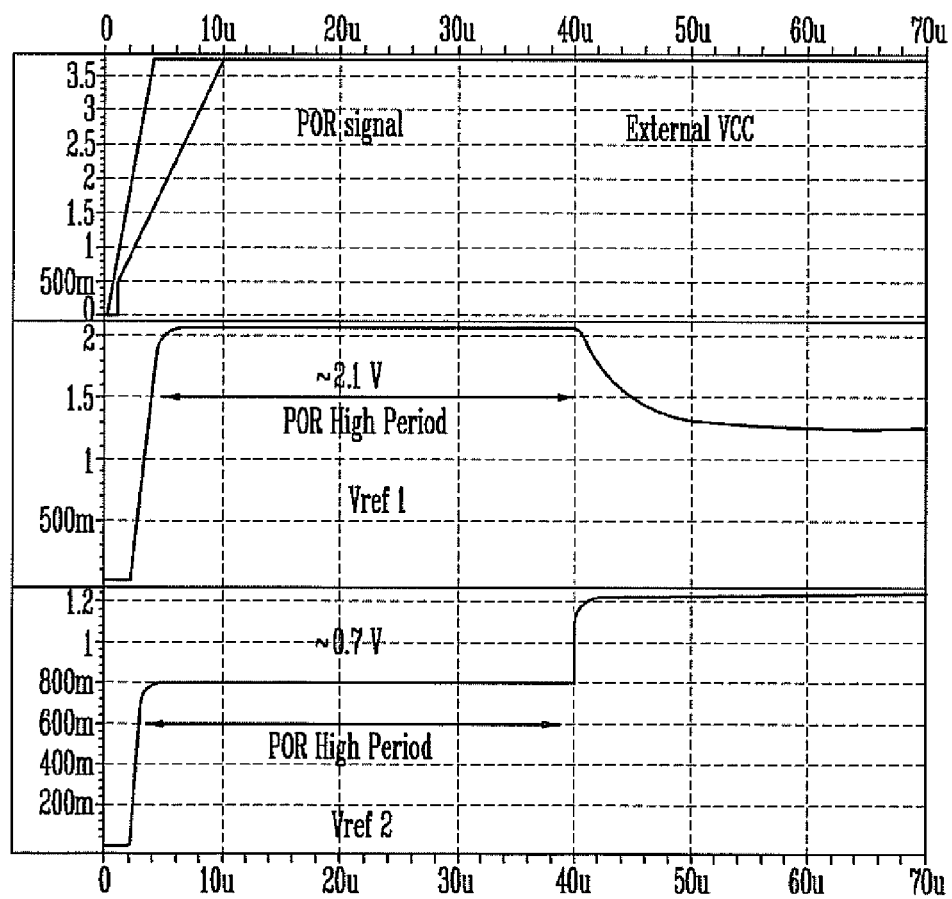
FIG. 4 is a graph showing the outputs of the reference voltage generation circuit in accordance with an embodiment of the present invention and a conventional reference voltage generation circuit.

FIG. 4 is a graph showing the outputs of the reference voltage generation circuit of the present invention and a conventional reference voltage generation circuit.

Referring to FIG. 4, in the case in which a POR signal, such as the Type B POR signal shown in FIG. 3, is inputted, if the reference voltage control unit 230 of FIG. 2 is not used, a first reference voltage Vref1 is outputted. Further, the reference voltage generation circuit 200 according to the embodiment of the present invention outputs a second reference voltage Vref2.

As shown in FIG. 4, if the reference voltage control unit 230 of FIG. 2 is not used, the first reference voltage Vref1 increases to at least 2.1 V while the POR signal is in a high level.

Such a high reference voltage level can generate errors in devices which operate in response to the first reference voltage Vref1.

Accordingly, the reference voltage generation circuit 200 according to the embodiment of the present invention maintains the second reference voltage Verf2 at a low voltage level (for example, about 0.7 V) while the POR signal abnormally maintains a high level. Thus, devices using the second reference voltage Vref2 are not affected.

As described above, the reference voltage generation circuit according to the present invention can output a constant reference voltage without being affected by the voltage level of an abnormal POR signal. Accordingly, the voltage level of an operation voltage using a reference voltage can be prevented from increasing, and so the operation voltage can be stably supplied.

What is claimed is:

1. A reference voltage generation circuit, comprising:
   a driving control unit configured to start up a reference voltage generation unit when a power-on reset (POR) signal is at a high voltage level;
   the reference voltage generation unit configured to start an operation in response to an operation of the driving control unit and to output a reference voltage when the POR signal is changed to a low voltage level; and
   a reference voltage control unit configured to prevent the reference voltage from increasing over a first voltage level when the POR signal is at the high voltage level.

2. The reference voltage generation circuit of claim 1, wherein, in response to disabling of the prevention of the reference voltage increase over the first voltage level, the reference voltage control unit is configured to output the reference voltage having a voltage level lower than a supply voltage supplied to the reference voltage generation unit but higher than a voltage level of the reference voltage obtained in response to enabling of the prevention of the reference voltage increase over the first voltage level.

3. The reference voltage generation circuit of claim 1, wherein the reference voltage control unit comprises a first diode and a first transistor coupled in series between an output terminal of the reference voltage generation unit and a ground terminal, and wherein the first transistor is configured to be turned on or off in response to the POR signal.

4. The reference voltage generation circuit of claim 3, wherein the first diode is turned on when a voltage level of the reference voltage is increased to at least the first voltage level.

5. The reference voltage generation circuit of claim 4, wherein the reference voltage is maintained at a voltage equal to a threshold voltage of the first transistor when the prevention of the reference voltage increase is enabled.

6. The reference voltage generation circuit of claim 1, wherein the reference voltage control unit is configured to output the reference voltage received from the reference voltage generation unit without a change when the reference voltage is equal to or less than the first voltage level and the POR signal is at the high voltage level.

7. The reference voltage generation circuit of claim 1, wherein the driving control unit includes a transistor having a gate to receive the POR signal and the reference voltage generation unit is further configured to continue to drive the reference voltage when the transistor is turned off in response to a change of the POR signal from the high voltage level to the low voltage level.

8. A reference voltage generation circuit, comprising:
a reference voltage generation unit configured to start an operation when a power-on reset (POR) signal is at a high voltage level and to generate a reference voltage when the POR signal is changed to a low voltage level; and
a trimming unit configured to operate in response to the POR signal and to trim the reference voltage when the POR signal is at the high voltage level.

9. The reference voltage generation circuit of claim 8, wherein the trimming unit comprises a first diode and a first transistor coupled in series between an output terminal of the reference voltage generation unit and a ground terminal, the first transistor being turned on or off in response to the POR signal.

10. The reference voltage generation circuit of claim 9, wherein the first diode is turned on when the voltage level of the reference voltage is increased to a first voltage level while the POR signal is at the high voltage level.

11. The reference voltage generation circuit of claim 10, wherein the trimming unit is configured to trim the reference voltage to a threshold voltage of the first transistor when the first diode is turned on.

12. The reference voltage generation circuit of claim 8, wherein the trimming unit is configured to prevent an increase of the reference voltage over a first voltage level when the POR signal is at the high voltage level and wherein, in response to disabling of the prevention of the reference voltage increase over the first voltage level, the trimming unit is further configured to output the reference voltage having a voltage level lower than a supply voltage supplied to the reference voltage generation unit but higher than a voltage level of the reference voltage obtained in response to enabling of the prevention of the reference voltage increase over the first voltage level.

13. The reference voltage generation circuit of claim 8, wherein the trimming unit includes a transistor having a gate to receive the POR signal and the reference voltage generation unit is further configured to continue to drive the reference voltage when the transistor is turned on in response to the high voltage level of the POR signal.

14. A voltage generation circuit, comprising:
a reference voltage generation unit configured to start an operation when a power-on reset (POR) signal is at a high voltage level and to generate a reference voltage when the POR signal is changed to a low voltage level;
a trimming unit configured to operate in response to the POR signal and to trim the reference voltage when the POR signal is at the high voltage level; and
a voltage-down converter configured to generate an internal voltage in response to the reference voltage.

15. The voltage generation circuit of claim 14, wherein the trimming unit is configured to prevent an increase of the reference voltage over a first voltage level when the POR signal is at the high voltage level and wherein, in response to disabling of the prevention of the reference voltage increase over the first voltage level, the trimming unit is further configured to output the reference voltage having a voltage level lower than a supply voltage supplied to the reference voltage generation unit but higher than a voltage level of the reference voltage obtained in response to enabling of the prevention of the reference voltage increase over the first voltage level.

16. The voltage generation circuit of claim 14, wherein the trimming unit includes a transistor having a gate to receive the POR signal and the reference voltage generation unit is further configured to continue to drive the reference voltage when the transistor is turned on in response to the high voltage level of the POR signal.

* * * * *